US007248126B2

(12) United States Patent
Kanbe

(10) Patent No.: US 7,248,126 B2
(45) Date of Patent: Jul. 24, 2007

(54) TEMPERATURE CORRECTION DEVICE AND VOLTAGE CONTROL OSCILLATION DEVICE

(75) Inventor: Shinichi Kanbe, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/503,088

(22) PCT Filed: Nov. 13, 2003

(86) PCT No.: PCT/JP03/14476

§ 371 (c)(1),
(2), (4) Date: Jul. 30, 2004

(87) PCT Pub. No.: WO2004/045062

PCT Pub. Date: May 27, 2004

(65) Prior Publication Data

US 2005/0128016 A1    Jun. 16, 2005

(30) Foreign Application Priority Data

Nov. 14, 2002    (JP)    ............................. 2002-331099

(51) Int. Cl.
*H03L 1/00*    (2006.01)
*G01J 5/20*    (2006.01)
*G01R 23/10*    (2006.01)

(52) U.S. Cl. ........................................ 331/66; 331/176
(58) Field of Classification Search .................. 331/66, 331/176, 74
See application file for complete search history.

(56) References Cited

U.S. PATENT DOCUMENTS 3,713,033 A    1/1973    Frerking

| 4,513,259 | A |   | 4/1985  | Frerking |
|-----------|---|---|---------|----------|
| 4,746,879 | A |   | 5/1988  | Ma et al. |
| 5,170,136 | A | * | 12/1992 | Yamakawa et al. ......... 331/176 |
| 5,856,766 | A | * | 1/1999  | Gillig et al. ................ 331/176 |

(Continued)

FOREIGN PATENT DOCUMENTS

GB    2360404    9/2001

(Continued)

OTHER PUBLICATIONS

High Speed CMOS Digital-to-Analog Converter with Linear Interpolator, Hong-wei Wang; Nov. 2000, IEEE Transactions on Consumer Electronics, vol. 46, No. 4.*

*Primary Examiner*—Benny Lee
*Assistant Examiner*—James Goodley
(74) *Attorney, Agent, or Firm*—Birch, Stewart, Kolasch & Birch, LLP

(57) ABSTRACT

A temperature correcting apparatus divides an actually measured waveform of correcting voltages, which are required at each of different temperatures, by a minimum resolution of D/A conversion; obtains voltage digital values representing voltage values at individual dividing points of the actually measured waveform, and obtains times corresponding to the voltage digital values; prestores pairs of the voltage digital values and times together with addresses as correcting data; reads out the correcting data in response to the detection address representing the temperature; extracts or calculates from the correcting data the voltage digital values and times about the correcting voltages required by the detection address; and sequentially supplying a D/A converter with the resultant voltage digital values in synchronization with the corresponding times.

10 Claims, 7 Drawing Sheets

U.S. PATENT DOCUMENTS

| | | |
|---|---|---|
| 5,892,408 A | 4/1999 | Binder |
| 5,994,970 A * | 11/1999 | Cole et al. .................. 331/68 |
| 6,463,266 B1 * | 10/2002 | Shohara .................. 455/196.1 |
| 6,559,731 B2 * | 5/2003 | Jakobsson .................. 331/176 |
| 2001/0048349 A1 | 12/2001 | Matsumoto et al. |

FOREIGN PATENT DOCUMENTS

| | | |
|---|---|---|
| JP | 56-042403 A | 4/1981 |
| JP | 05-160754 A | 6/1993 |
| JP | 08-146125 A | 6/1996 |
| JP | 10-197625 A | 7/1998 |
| JP | 10-256831 A | 9/1998 |
| JP | 2001-028514 A | 1/2001 |
| JP | 2001-068996 A | 3/2001 |
| JP | 2002-062355 A | 2/2002 |

* cited by examiner

TEMPERATURE CORRECTION DEVICE AND VOLTAGE CONTROL OSCILLATION DEVICE

TECHNICAL FIELD

The present invention relates to a temperature correcting apparatus and a voltage-controlled oscillation apparatus for detecting the ambient temperature of an apparatus to be corrected such as an oscillation circuit, whose operation is susceptible to the effect of temperature, and for supplying a voltage waveform passing through correcting processing to the apparatus to be corrected via a D/A converter.

BACKGROUND ART

An oscillation circuit is a typical temperature sensitive circuit whose normal operation is impaired by the effect of the ambient temperature. This is because the frequency characteristics of the resonator of the oscillation circuit have temperature dependence such as a cubic curve. Accordingly, it is necessary for the temperature sensitive circuit to correct its operation in response to the temperature. A conventional temperature correcting apparatus used for this purpose generally detects the ambient temperature with a temperature sensor, generates a correcting voltage in response to the detected ambient temperature, and carries out correcting control by supplying the correcting voltage to the apparatus to be corrected such as an oscillation circuit. However, it is necessary for the apparatus to be corrected, which requires highly accurate temperature correction over a wide temperature range, to subdivide the temperature range to make correction of the individual subdivisions, and to consider the detection error of the temperature sensor together with the reduction in the effect on the variations in the detection characteristics of the sensor.

A conventional temperature correcting apparatus meeting the foregoing requirements is disclosed in Japanese patent application laid-open No. 2001-68996. It converts a plurality of temperature detection values to addresses, corrects the temperature characteristics of the temperature sensor in response to the individual addresses, and stores the correcting addresses in a storage in advance. In addition, it stores correcting data, which are determined by considering the correcting voltages for correcting the temperature characteristics of the apparatus to be corrected, in the storage in advance in correspondence to the individual correcting addresses. Then, it detects the ambient temperature with a temperature sensor, carries out the A/D conversion of the detected temperature value to an address, and reads the correcting address corresponding to the converted address. Subsequently, it reads the correcting data according to the correcting address read out, and D/A converts the correcting data to produce a correcting voltage to be fed to the apparatus to be corrected. To achieve highly accurate correction by the technique, however, an increasing amount of the D/A data is required. On the other hand, Japanese patent application laid-open No. 2001-28514 discloses a technique for reducing memory capacity by storing differential data with respect to a specified temperature into a memory instead of storing all the D/A data.

With the foregoing configuration, the conventional temperature correcting apparatus must consider the quantization error of the D/A converter. This is because when the D/A converter generates the voltage waveform for correcting a given temperature, the data is input at constant sampling intervals. Thus, to reduce the error of the D/A converter, which consists of the quantization error always accompanying the quantization, a higher bit D/A converter is required. Thus using the higher bit D/A converter results in an increase in the amount of the D/A data and in the cost. On the other hand, Japanese patent application laid-open No. 2001-28514, which calculates the D/A data by the correcting calculation, has a problem of bringing about quantization error at every voltage output carried out by the D/A conversion at constant sampling intervals.

The present invention is implemented to solve the foregoing problems. Therefore it is an object of the present invention to provide a temperature correcting apparatus that carries out highly accurate correction by curbing the occurrence frequency of the quantization error of the D/A converter even by using a low bit D/A converter, and that implements low cost temperature correcting processing, and a voltage-controlled oscillation apparatus using the temperature correcting apparatus.

DISCLOSURE OF THE INVENTION

According to a first aspect of the present invention, there is provided a temperature correcting apparatus including: a storing unit for dividing an actually measured waveform of correcting voltages, which are required by an apparatus to be corrected at each of a plurality of different temperatures, by a positive integer multiple of a minimum resolution of D/A conversion (the resolution can be represented as $2^n$ in the case of n bits), for obtaining voltage digital values representing voltage values at individual dividing points of the actually measured waveform and obtaining times corresponding to the voltage digital values, for generating a plurality of pairs consisting of the voltage digital values and the times at each temperature as correcting data, and for prestoring the correcting data of individual temperatures in correspondence with addresses representing the temperatures; temperature sensor means for detecting an ambient temperature of the apparatus to be corrected and producing a detection voltage; A/D converting means for A/D converting the detection voltage to produce detection address representing the temperature; processing means for reading out correcting data from the storing unit according to the detection address, extracting or calculating the voltage digital values about the correcting voltages required by the detection address, and the times corresponding to the voltage digital values from the correcting data, and for sequentially outputting the resultant voltage digital values in synchronization with the times; and D/A converting means for generating correcting voltages to be supplied to the apparatus to be corrected by performing D/A conversion of the voltage digital values output.

According to a second aspect of the present invention, there is provided a temperature correcting apparatus including: a storing unit for storing a plurality of pairs of digital data consisting of pairs of voltage data and time data corresponding to the voltage data for each of a plurality of different detection addresses corresponding to a plurality of temperatures; an A/D converter for carrying out A/D conversion of an ambient temperature detected by a temperature sensor, and for outputting a corresponding detection address through the A/D conversion; a processor for sequentially acquiring time data from the storing unit according to the detection address output from the A/D converter, and for sequentially outputting the voltage data corresponding to the time data at intervals of a positive integer multiple of a minimum resolution of the D/A converter in response to the timings specified by the time data acquired; and a D/A converter for carrying out D/A conversion of the voltage data output from the processor, and for supplying D/A conversion results to the apparatus to be corrected.

In this way, the temperature correcting apparatus obtains the voltage output based on integer multiples of the minimum resolution $2^n$ of the D/A conversion rather than the voltage output based on the number of times of the sampling by using a low-bit D/A converter. In addition, it can suppress D/A conversion error even after the temperature correcting processing. Accordingly, it offers an advantage of being able to carry out highly accurate temperature correcting processing. As a result, it has an advantage that it can be configured using a low cost D/A converter.

BEST MODE FOR CARRYING OUT THE INVENTION

The best mode for carrying out the invention will now be described with reference to the accompanying drawings to explain the present invention in more detail.

EMBODIMENT 1

Figure 1:
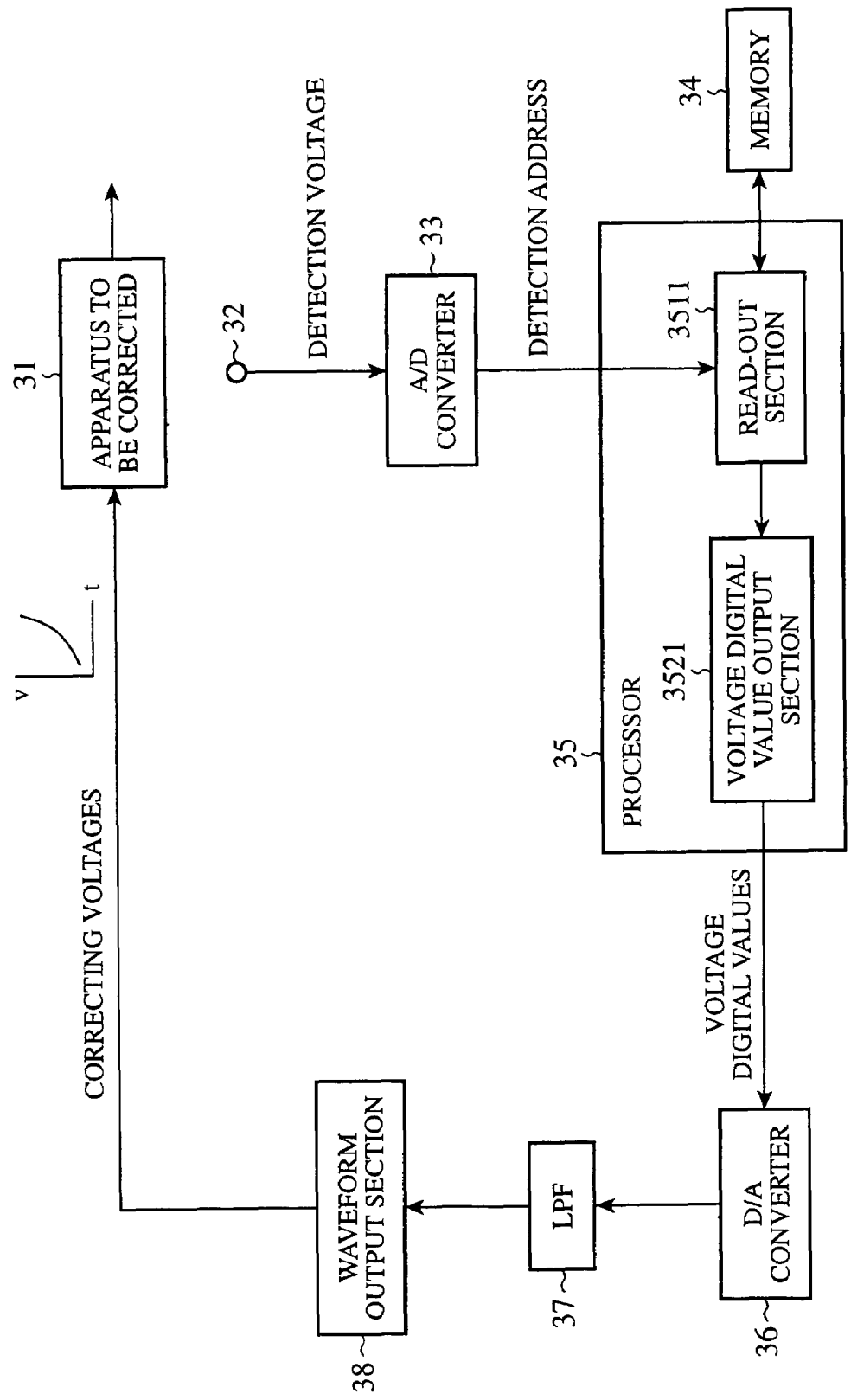
FIG. 1 is a block diagram showing a circuit configuration of a temperature correcting apparatus of an embodiment 1 in accordance with the present invention.
Figure 2:
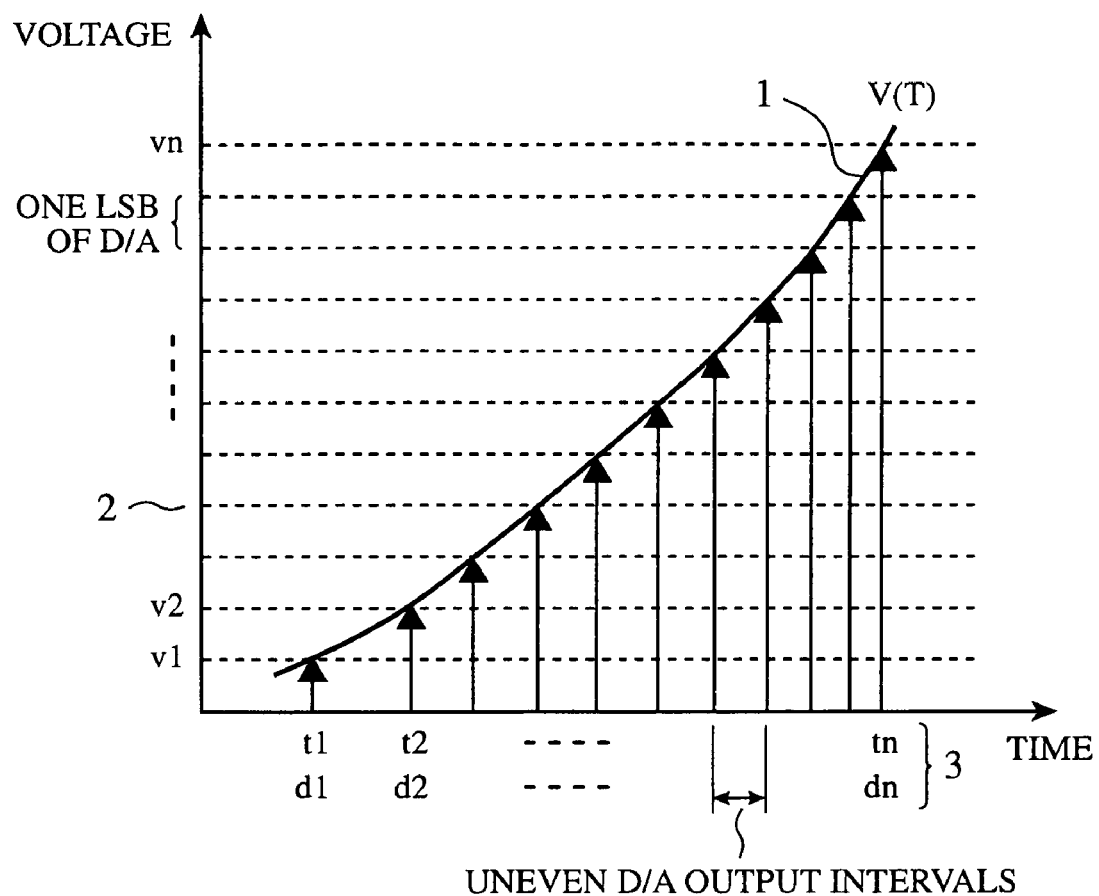
FIG. 2 is a graph illustrating a waveform of correcting voltages of the embodiment 1 in accordance with the present invention.

FIG. 1 is a block diagram showing a circuit configuration of a temperature correcting apparatus of an embodiment 1 in accordance with the present invention. In FIG. 1, an apparatus to be corrected 31 is a circuit whose normal operation is susceptible to the influence of the ambient temperature. A temperature correcting apparatus with the following configuration generates a correcting voltage required by the apparatus to be corrected 31 in response to the variations in the ambient temperature. The correcting voltage is generated by the D/A conversion of the temperature correcting apparatus, and has a voltage waveform 1 as illustrated in FIG. 2, where time intervals of the D/A conversion are uneven. In FIG. 2, the reference numeral 2 designates a voltage axis graduated in every one LSB of the D/A conversion, and 3 designates a time axis.

A temperature sensor (temperature sensor means) 32, which is placed on the periphery of the apparatus to be corrected 31, detects its ambient temperature, picks up a detection voltage, and supplies it to an A/D converter (A/D converting means) 33. The A/D converter 33 converts the detection voltage to digital data. The data is fed to a processor (processing means) 35 as a detection address representing the temperature. The processor 35 has a microcomputer, and includes a read-out section 3511 and a voltage digital value output section (voltage digital value output means) 3521 to carry out the operation which will be described later.

Figure 3:
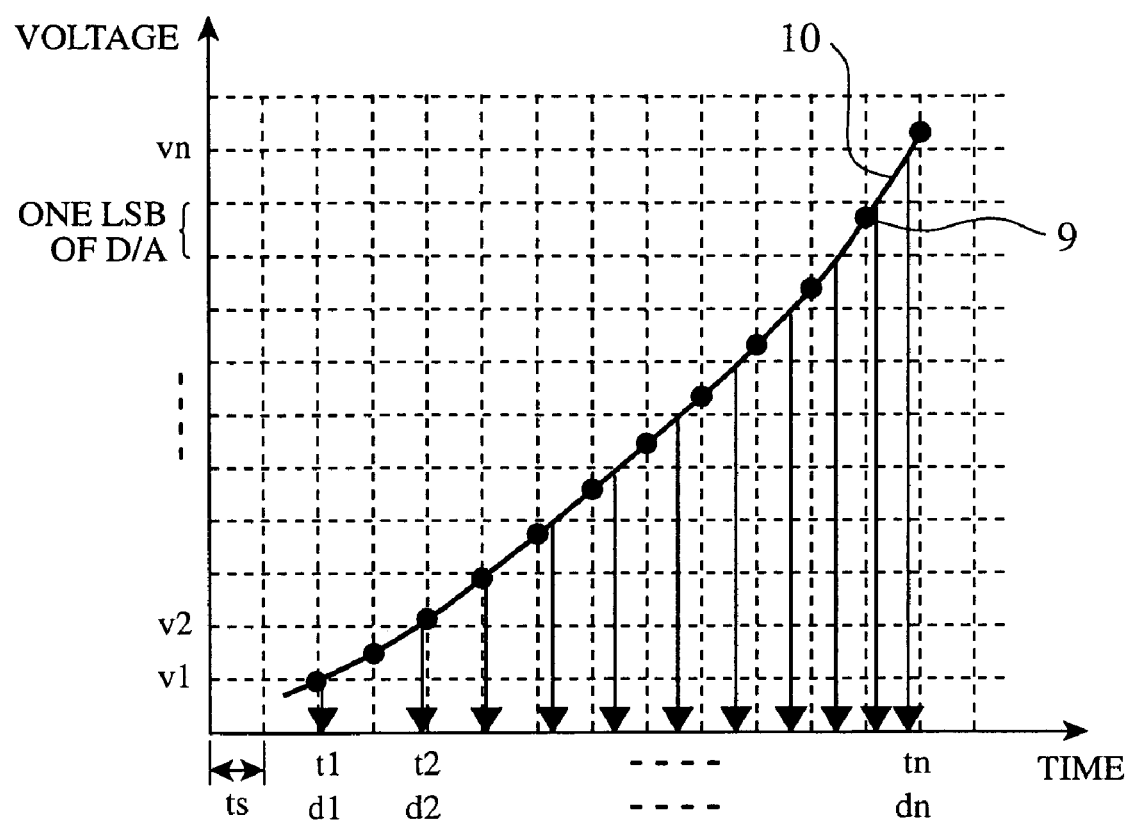
FIG. 3 is a graph illustrating a method of converting an actually measured waveform of the correcting voltages to digital data in the embodiment 1 in accordance with the present invention.

A memory (storing unit) 34 stores preset data in the following way. FIG. 3 is a graph illustrating a method of converting an actually measured waveform of the correcting voltages to digital data. Individual points 9 represent voltage values obtained by actually measuring the correcting voltages, which are required by the apparatus to be corrected at a particular ambient temperature, at regular intervals in the time direction. A voltage waveform in an observation range is formed by joining two adjacent points of the actually measured voltage values successively by lines 10. The waveform of the correcting voltages is divided at the LSB intervals of the D/A conversion, and voltages v1, v2, . . . , vn at the individual dividing points (intersections of the dividing lines and the waveform) are converted into digital data with a predetermined number of bits (eight bits, for example), thereby obtaining voltage digital values d1, d2, . . . , dn. In addition, times t1, t2, . . . , tn at the individual intersections, at which the voltage digital values are acquired, are obtained as the data. Subsequently, pairs (d1, t1), (d2, t2), . . . , (dn, tn) of the voltage digital values d1, d2, . . . , dn and the corresponding individual times t1, t2, . . . , tn are formed, and all the pairs are made one correcting data, which is provided with an address and stored in the memory 34. The address is data representing the temperature, and belongs to the same type of data as the detection address of the A/D converter 33 representing the detection temperature of the temperature sensor 32.

FIG. 3 illustrates the actually measured waveform of the correcting voltages for the particular temperature. For other temperatures, the individual correcting data are generated in the same manner from the actually measured waveforms, and are stored in the memory 34 with the individual addresses added to the correcting data.

In the processor 35, the read-out section 3511 reads the correcting data corresponding to the detection address from the memory 34 according to the input detection address, and supplies the correcting data to the voltage digital value output section 3521. The voltage digital value output section 3521 sequentially supplies the D/A converter 36 with the voltage digital values d1, d2, . . . , dn of the correcting data in synchronization with the times t1, t2, . . . , tn. The voltage digital values are D/A converted by the D/A converter 36, and are generated as the correcting voltage as illustrated in FIG. 2 via a noise eliminating low-pass filter (LPF) 37 and a waveform output section 38 for shaping a smooth analog waveform. The generated correcting voltage is fed to the apparatus to be corrected 31 to perform the temperature compensation of its operation. The D/A converter 36, low-pass filter 37 and waveform output section 38 constitute a D/A converting means in accordance with the present invention.

As an example, assume that the operation clock of the microcomputer used as the processor 35 is 5 MHz, the D/A conversion is assigned 8 bit, and the maximum voltage of the D/A conversion is 5 V in amplitude. Since the settling time of the D/A conversion is considered to be constant, it is possible to carry out control in which 1 LSB=5 V/$2^8$ =5000 mV/256=19.53 mV, and the minimum value of the time intervals between adjacent voltage digital values dn is 200 ns.

Since the voltage data generated by this method are represented using multiples of the LSB ($2^n$) of the D/A conversion, it is possible to reduce the occurrence frequency of the quantization error for each LSB of the D/A converter, and to obtain highly accurate output waveform. For example, using the 8 bit D/A converter makes it possible to obtain the waveform equivalent to 10 bit D/A converter in accuracy.

As described above, the embodiment 1 is configured such that it divides the actually measured waveform of the correcting voltages, which are required by the apparatus to be corrected, at the minimum resolution (LSB) intervals of the D/A conversion for each of the different temperatures, obtains the voltage digital values representing the voltage values at the individual dividing points of the actually measured waveform and the times corresponding to the voltage digital values, generates a plurality of pairs of the voltage digital values and the times for each temperature as the correcting data, and stores the correcting data at the individual temperatures in the memory 34 in advance in correspondence with the addresses representing the individual temperatures, and that the processor 35 reads the correcting data corresponding to the detection address according to the detection address, and sequentially outputs the voltage digital values of the correcting data in synchronization with the corresponding times, thereby enabling the D/A converter 36 to generate the voltage waveform. Thus, the present embodiment 1 can generate the voltages in the multiples of the minimum resolution $2^n$ using a low-bit D/A converter. Thus, it offers an advantage of being able to achieve highly accurate correction with reducing the occurrence frequency of the quantization error of the D/A converter, and to implement the temperature correcting processing apparatus using low cost memory, microcomputer, D/A converter and the like because of the reduced data amount.

EMBODIMENT 2

Figure 4:
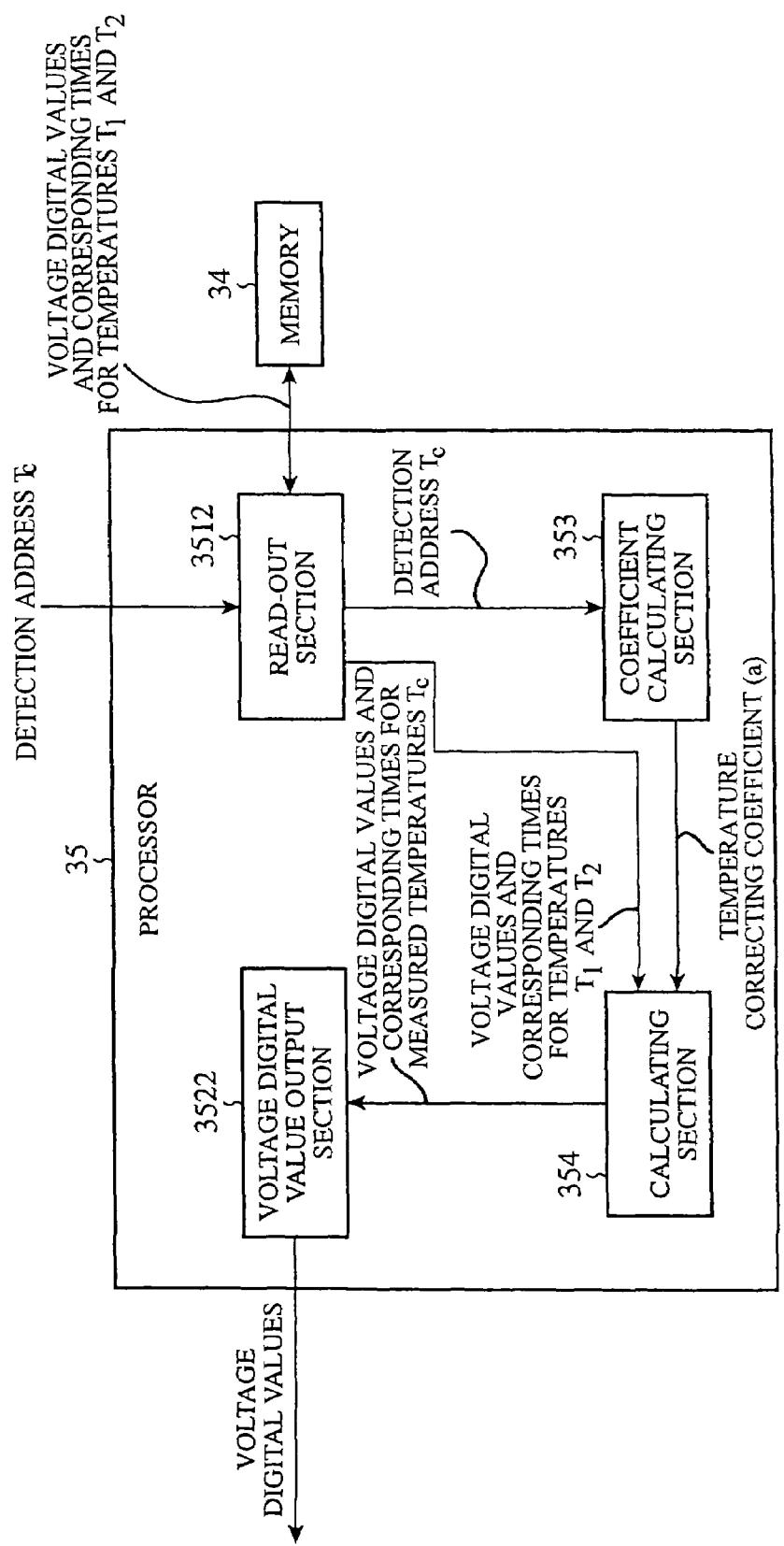
FIG. 4 is a block diagram showing a part of a circuit configuration of the temperature correcting apparatus of an embodiment 2 in accordance with the present invention.
Figure 5:
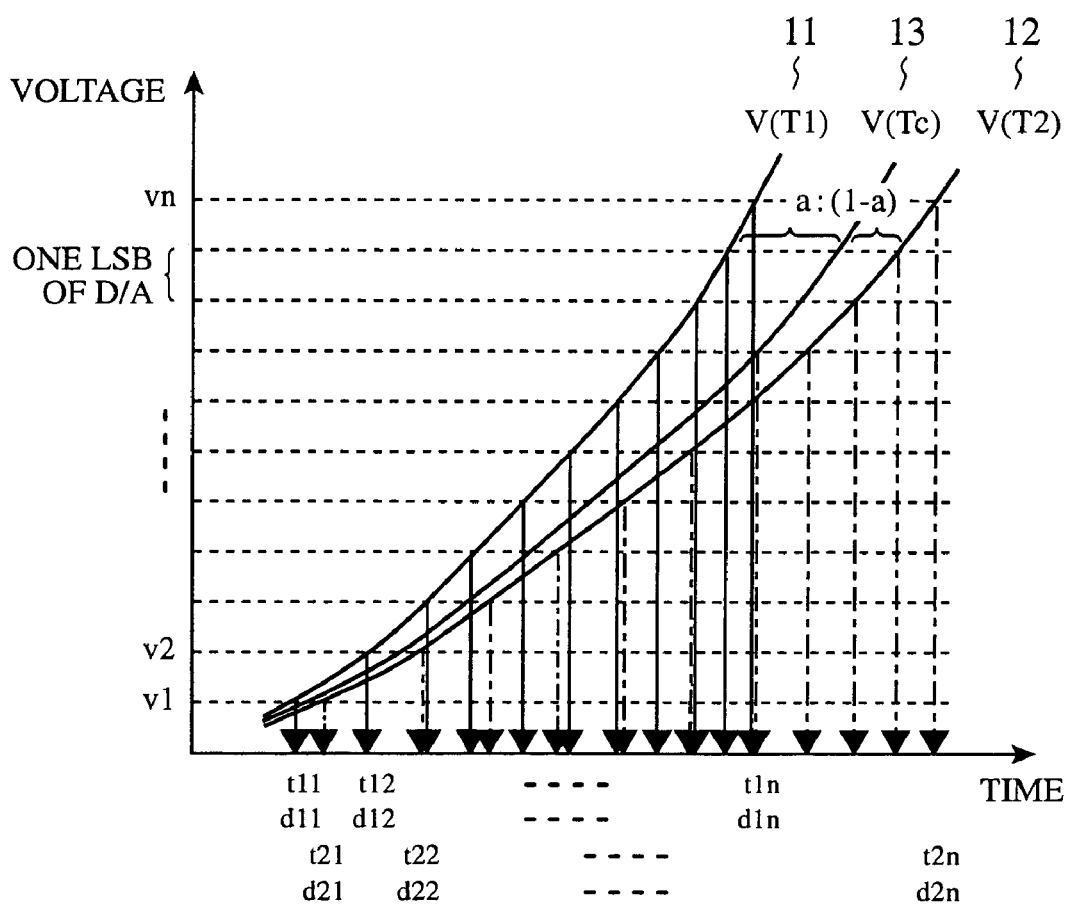
FIG. 5 is a graph illustrating a method of converting an actually measured waveform of the correcting voltages to digital data in the embodiment 2 in accordance with the present invention.

FIG. 4 is a block diagram showing a configuration of the processor of the temperature correcting apparatus of an embodiment 2 in accordance with the present invention; and FIG. 5 is a graph illustrating a method of converting the actually measured waveform of the correcting voltages to digital data in the embodiment 2. In the present embodiment 2, a temperature correcting apparatus will be described which uses only two sets of correcting data of two temperatures T1 and T2 as the correcting data to be prestored in the memory 34.

As for the actually measured waveform 11 of the correcting voltages at temperature T1 and the actually measured waveform 12 of the correcting voltages at temperature T2 as illustrated in FIG. 5, the correcting data are generated by the method as described in the foregoing embodiment 1, and are stored in the memory 34 in advance. More specifically, the pairs of the voltage digital values and the times at the temperature T1 are (d11, t11), (d12, t12), ..., (d1$n$, t1$n$), and the pairs of the voltage digital values and the times at the temperature T2 are (d21, t21), (d22, t22), ..., (d2$n$, t2$n$). These data are stored in correspondence with the addresses of the temperatures T1 and T2.

When the temperature sensor 32 detects a temperature Tc (where T1<Tc<T2 or Tc=T1 or Tc=T2), the detection address obtained by A/D converting the detection voltage is supplied to the processor 35. A read-out section (read-out means) 3512 reads the data set of the two temperatures T1 and T2 in accordance with the detection address. A coefficient calculating section (coefficient calculating means) 353 calculates a temperature difference ratio of the temperature indicated by the detection address from the addresses of the set of the two temperatures T1 and T2 and the detection address as the temperature correcting coefficient.

The temperature correcting coefficient a at the temperature Tc is given by the following linear approximate expression about the temperatures T1 and T2.

$$a=(T1-Tc)/(T1-T2)$$

The coefficient a is given when the ratio of the temperature Tc to the temperatures T1 and T2 is a:(1−a).

Subsequently, a time calculating section (time calculating means) 354 calculates times tcn, at which the voltage digital values dcn (where, dcn=d1$n$=d2$n$ in this case) at temperature Tc are output, from the coefficient a and the individual times t1$n$ and t2$n$ corresponding to the voltage digital values d1$n$ and d2$n$ (where d1$n$=d2$n$ in this case) indicating the same voltage value in the two correcting data. Using the linear approximation, the output times tcn on the time axis for performing the D/A conversion is given by the following expression.

$$tcn=(1-a) \times t1n + a \times t2n \text{ (where } n>1\text{)}$$

The times tc1, tc2, ..., tcn and the voltage digital values dc1, dc2, ..., dcn sequentially calculated in this way are supplied to a voltage digital value output section (voltage digital value output means) 3522. The voltage digital value output section 3522 sequentially supplies the D/A converter 36 with the voltage digital values corresponding to the individual output times as the voltage digital values required by the detection address. Thus, the waveform of the correcting voltages 13 corresponding to the temperature Tc obtained by the D/A conversion by the D/A converter 36 and passing through the low-pass filter 37 and waveform output section 38 has the relationships with the voltage waveforms 11 and 12 of the two temperatures T1 and T2 as illustrated in FIG. 5. Consequently, the present embodiment 2 can reduce the occurrence frequency of the quantization error of the D/A converter or the like for any voltage waveform obtained by the temperature correction, thereby being able to provide highly accurate output waveform.

As described above, the present embodiment 2 is configured such that the memory 34 stores the correcting data of the two different temperatures T1 and T2 generated in the same manner as in the foregoing embodiment 1, that the processor 35 reads out the correcting data of the two temperatures T1 and T2 according to the detection address, calculates the temperature difference ratio of the temperatures indicated by the detection address from the addresses of the two read-out correcting data and the detection address, calculates the output times for carrying out the D/A conversion from the temperature difference ratio and the times corresponding to the voltage digital values indicating the same voltage values of the two correcting data, and sequentially outputs the voltage digital values of the same voltage values according to the calculated output times as the voltage digital value required by the detection address. Thus, using the low-bit D/A converter, the present embodiment 2 offers an advantage of being able to achieve highly accurate correction with reducing the occurrence frequency of the quantization error of the D/A converter, and to implement the temperature correcting processing apparatus using the low cost memory, microcomputer, D/A converter and the like because of the reduced data amount. In addition, the present embodiment 2 uses only two sets of prestored data of the different temperatures T1 and T2, and calculates the correcting voltage corresponding to the intermediate detection temperature. Thus, it is applicable to the case where the temperature range of the location of the apparatus to be corrected 31 is narrow, and the upper and lower values of the temperature are known in advance. As a result, it offers an advantage of being able to reduce the amount of data to be stored in the memory.

EMBODIMENT 3

Figure 6:
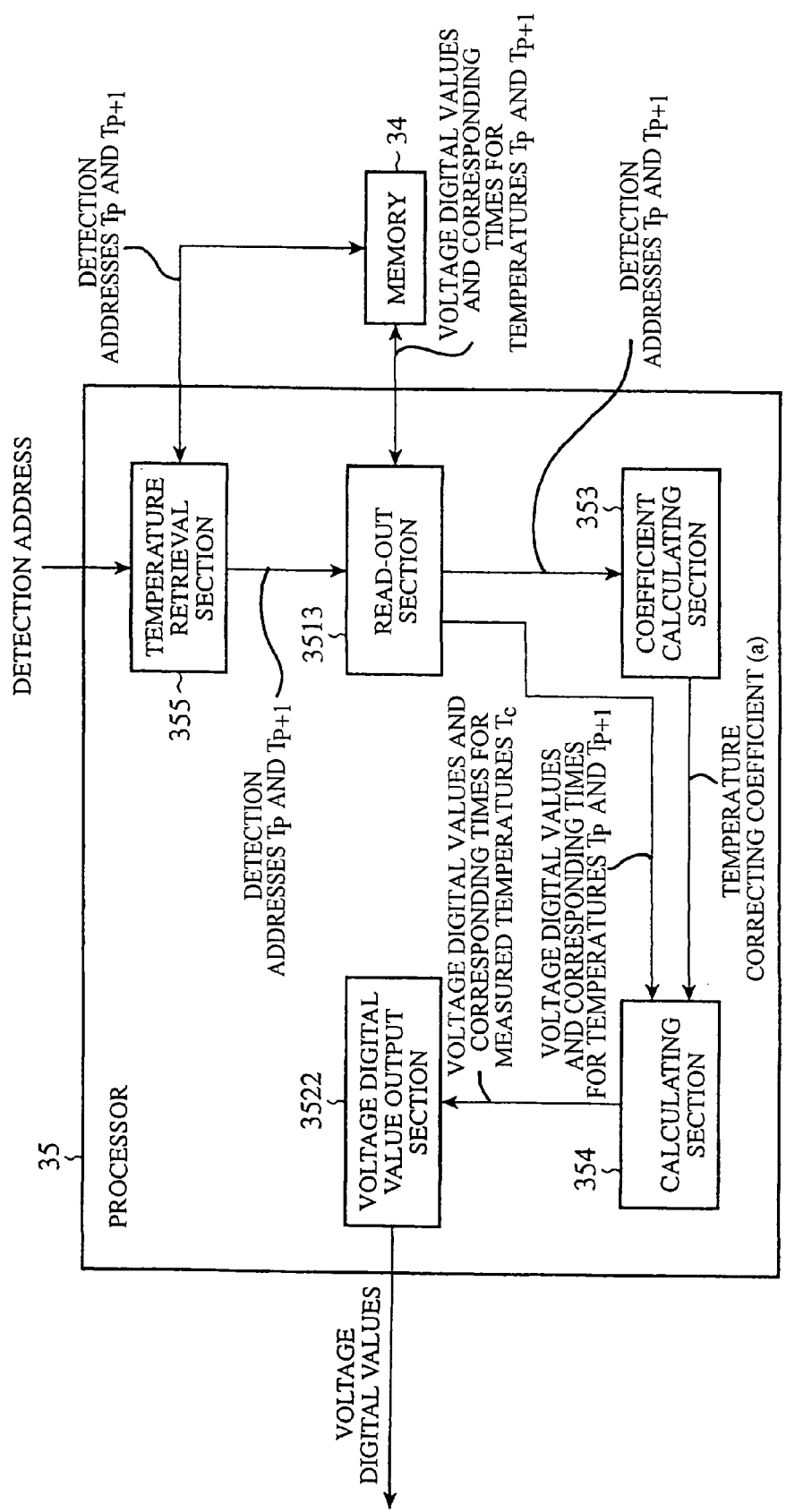
FIG. 6 is a block diagram showing a part of a circuit configuration of the temperature correcting apparatus of an embodiment 3 in accordance with the present invention.
Figure 7:
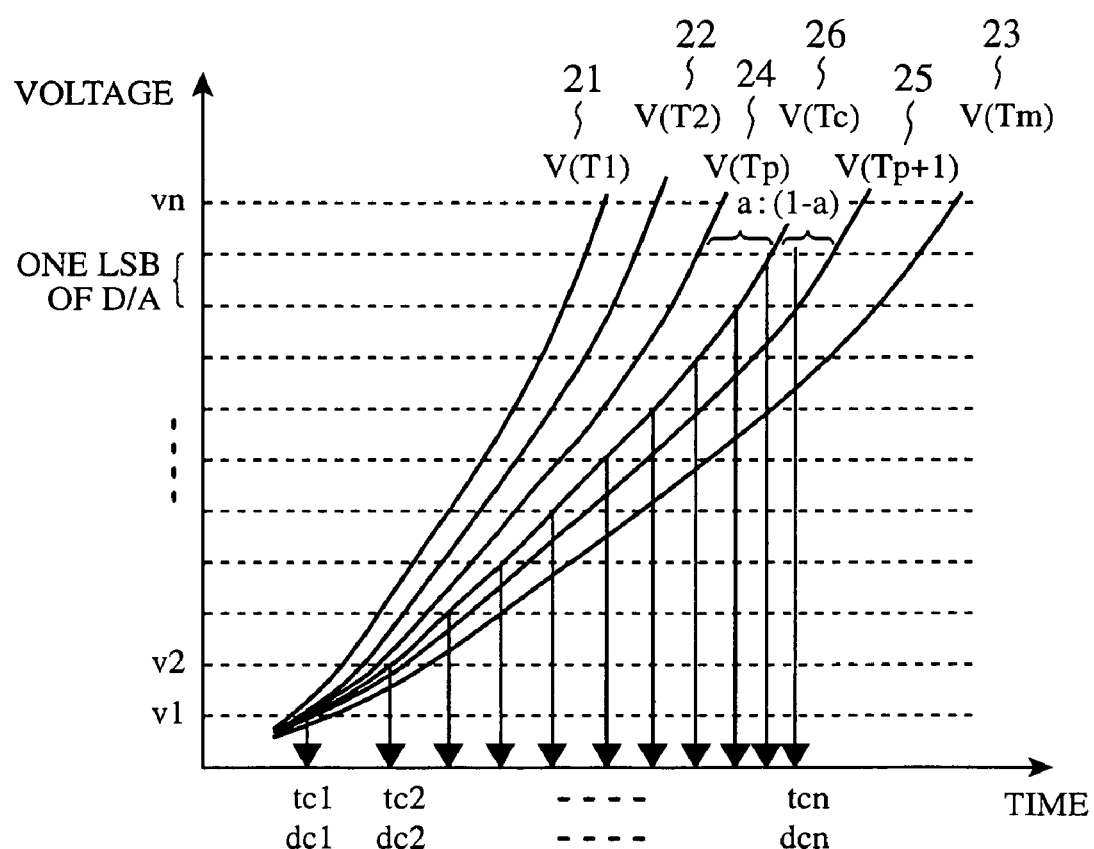
FIG. 7 is a graph illustrating a method of converting an actually measured waveform of the correcting voltages to digital data in the embodiment 3 in accordance with the present invention.

FIG. 6 is a block diagram showing a configuration of the processor of the temperature correcting apparatus of an embodiment 3 in accordance with the present invention; and FIG. 7 is a graph illustrating a method of converting the actually measured waveform of the correcting voltages to digital data in the embodiment 3. In the present embodiment 3, the temperature correcting apparatus uses the correcting data consisting of a plurality of temperatures T1–Tm as the correcting data to be prestored in the memory 34, where m is the number of the actually measured waveforms of the correcting voltages and is greater than three.

In FIG. 7, reference numerals 21, 22 and 23 designate the actually measured waveforms of the correcting voltages at temperatures T1, T2, and Tm, and 24 and 25 designate the actually measured waveforms of the correcting voltages of temperatures Tp and Tp+1, where, p=1, . . . , m. The reference numeral 26 designates the waveform of the correcting voltages required at the temperature Tc detected by the temperature sensor 32. As seen from FIG. 7, the temperatures Tp and Tp+1 (Tp<Tc<Tp+1 or Tc=Tp or Tp+1) are two adjacent actually measured waveforms of the correcting voltages closest to the temperature Tc.

In FIG. 6, when the detection address of the temperature Tc arrives at the processor 35, a temperature retrieval section (temperature retrieval means) 355 retrieves two addresses indicating the two adjacent temperatures Tp and Tp+1 closest to the temperature Tc indicated by the detection address from the plurality of addresses in the memory 34 in response to the detection address. According to the two retrieved addresses, a read-out section (read-out means) 3513 reads the correcting data of the temperatures Tp and Tp+1 corresponding to the two addresses from the memory 34. A coefficient calculating section 353 calculates the temperature difference ratio a of the temperature Tc indicated by the detection address from the addresses of the correcting data of the two temperatures Tp and Tp+1 and the detection address in the same manner as in the foregoing embodiment 2.

$a=(Tp-Tc)/(Tp-Tp+1)$

Subsequently, a time calculating section 354 calculates output times tc1, tc2, . . . , tcn for carrying out the D/A conversion from the individual times tp1, tp2, . . . , tpn, which correspond to the voltage digital values indicating the same voltage values in the sets of the two temperatures Tp and Tp+1, and from the temperature difference ratio a by the following expression.

$tci=(1-a) \times tpi + a \times ti+1$ $(i=1, 2, \ldots, n)$

According to the calculated output times tc1, tc2, tcn, a voltage digital value output section 3522 sequentially outputs the voltage digital values dc1, dc2, . . . , dcn of the same voltage values as the voltage digital values required by the detection address. The waveform of the correcting voltages corresponding to the temperature Tc, which passes through the D/A conversion by the D/A converter 36 and is obtained via the low-pass filter 37 and waveform output section 38 has the relationships with the voltage waveforms 24 and 25 at the two temperatures Tp and Tp+1 as designated by the reference numeral 26 of FIG. 7. Preparing a lot of data of the actually measured waveforms of the correcting voltages makes it possible to generate the correcting voltages for the detection temperature at an intermediate position, thereby being able to achieve highly accurate temperature correction. In addition, a highly accurate output waveform can be obtained because the occurrence frequency of the quantization error and the like of the D/A converter can be reduced for any voltage waveform after the correction.

As described above, the present embodiment 3 is configured such that the memory 34 prestores the plurality of correcting data generated in the same manner as in the foregoing embodiment 1, that the processor 35 retrieves two addresses indicating two adjacent temperatures closest to the temperature indicated by the detection address from the plurality of addresses in the memory according to the detection address, reads out the correcting data corresponding to the two addresses in accordance with the two retrieved addresses, calculates the temperature difference ratio of the temperature indicated by the detection address from the addresses of the two correcting data read out and the detection address, calculates the output times for carrying out the D/A conversion from the individual times corresponding to the voltage digital values indicating the same voltage values of the two correcting data and from the temperature difference ratio, and sequentially supplies the D/A converter 36 with the voltage digital values of the same voltage values according to the calculated output times as the voltage digital values required by the detection address. Thus, the present embodiment 3 can achieve the highly accurate temperature correction by preparing a lot of data of the voltage waveforms for the temperature correction in advance. In addition, it offers an advantage of being able to produce a highly accurate output waveform by reducing the occurrence frequency of the quantization error of the D/A converter and the like for any voltage waveform after the correction by using a low-bit D/A converter. Furthermore, it offers an advantage of implementing the temperature correcting processing apparatus using inexpensive memory, microcomputer and D/A converter because the amount of data can be reduced.

Although the foregoing embodiments 1–3 divide the actually measured voltage waveform on the LSB unit basis when converting it into the digital data, this is not essential. For example, the dividing width can be a positive integer multiple of the LSB, which will presents similar advantages as easily understood.

EMBODIMENT 4

Recently, Intelligent Transport Systems (ITS) have been developed, which utilize a vehicle-installed radar for measuring a distance between vehicles. A promising millimeter wave radar as the vehicle-installed radar is an FM-CW (Frequency modulation Continuous Wave) radar. The FM-CW radar obtains a beat signal including both the distance and velocity components by supplying a voltage-controlled oscillation apparatus (VCO) with a triangular or sawtooth voltage at a predetermined period for carrying out frequency modulation of a transmission wave, and by mixing a reflected wave from an object with a part of the transmission wave. The FM-CW radar is suitable as the vehicle-installed radar because its radio frequency circuit for obtaining the beat signal and data processing is rather simple, and it can directly obtain the distance and velocity signal. Considering severe conditions of vehicle installation, however, the voltage-controlled oscillation apparatus is susceptible to the influence of the temperature.

The temperature correcting apparatus described in the embodiments 1–3 can be used as a means for generating the triangular or sawtooth correcting voltage to be supplied to the voltage-controlled oscillation apparatus operating as the apparatus to be corrected 31, and is applicable to the temperature correction of the transmission wave of the FM-CW radar. Consequently, the FM-CW radar utilizing the temperature correcting apparatus in accordance with the present invention is suitable for a vehicle-installed product that must satisfy the requirements of high performance and low cost.

INDUSTRIAL APPLICABILITY

As described above, according to the present invention, highly accurate temperature correcting processing of the voltage-controlled oscillation apparatus can be achieved using the low cost D/A converter. Therefore applying it to the vehicle-installed FM-CW radar for measuring the distance between vehicles is expected to enable it to sufficiently cope with the severe temperature conditions.

What is claimed is:

1. A temperature correcting apparatus comprising:
   a storing unit for storing correcting data for individual temperatures in correspondence with addresses representing the individual temperatures, the correcting data for an individual temperature being generated by dividing an actually measured waveform of correcting voltages, which are required by an apparatus to be corrected at the individual temperatures, by a positive integer multiple of a minimum resolution of a D/A converter to obtain voltage digital values representing voltage values at individual dividing points of the actually measured waveform and times corresponding to the dividing points, and generating a plurality of pairs consisting of the voltage digital values and the corresponding times;
   temperature sensor means for detecting an ambient temperature of the apparatus to be corrected and producing a detection voltage;
   an A/D converter for A/D converting the detection voltage to a detection address representing the temperature;
   processing means for reading out correcting data from said storing unit according to the detection address, extracting or calculating the voltage digital values about the correcting voltages required by the detection address, and the times corresponding to the voltage digital values from the correcting data, and for sequentially outputting the resultant voltage digital values in synchronization with the times; and
   a D/A converter for generating correcting voltages to be supplied to said apparatus to be corrected by performing D/A conversion of the voltage digital values output.

2. The temperature correcting apparatus according to claim 1, wherein
   said storing unit prestores correcting data of each of two different temperatures, and
   said processing means comprises:
   read-out means for reading correcting data of each of the two temperatures in response to the detection address;
   coefficient calculating means for calculating a temperature difference ratio of a temperature indicated by the detection address from the addresses of the correcting data of the two temperatures read out and from the detection address;
   time calculating means for calculating output times for carrying out the D/A conversion from the times corresponding to the voltage digital values indicating same voltage values of the correcting data of the two temperatures and from the temperature difference ratio; and
   voltage digital value output means for sequentially outputting the voltage digital values of the same voltage values in synchronization with the calculated output times, as voltage digital values required by the detection address.

3. The temperature correcting apparatus according to claim 1, wherein
   said storing unit prestores correcting data of each of a plurality of temperatures, and
   said processing means comprises:
   temperature retrieval means for retrieving two addresses representing two adjacent temperatures closest to a temperature indicated by the detection address from a plurality of addresses in said storing unit in response to the detection address,
   read-out means for reading the correcting data corresponding to the two retrieved addresses according to the two addresses;
   coefficient calculating means for calculating a temperature difference ratio of a temperature indicated by the detection address from the correcting data of the two temperatures read out and from the detection address;
   time calculating means for calculating output times for carrying out the D/A conversion from the times corresponding to the voltage digital values indicating same voltage values of the correcting data of the two temperatures and from the temperature difference ratio; and
   voltage digital value output means for sequentially outputting the voltage digital values of the same voltage values in synchronization with the calculated output times, as voltage digital values required by the detection address.

4. A temperature correcting apparatus comprising:
   a storing unit for storing a plurality of pairs of digital data consisting of pairs of voltage data and time data corresponding to the voltage data for each of a plurality of different detection addresses corresponding to a plurality of temperatures;
   an A/D converter for carrying out A/D conversion of an ambient temperature detected by a temperature sensor, and for outputting a corresponding detection address through the A/D conversion;
   a processor for acquiring, according to the detection address output from said A/D converter, a plurality of pairs of the digital data corresponding the detection address from said storing unit, and for sequentially outputting voltage data corresponding to the time data in response to timings determined by the time data of the digital data acquired; and a D/A converter for carrying out D/A conversion of the voltage data output from said processor, and for supplying D/A conversion results to said apparatus to be corrected, wherein said processor sequentially outputs the voltage data at intervals of a positive integer multiple of a minimum resolution of said D/A converter.

5. A voltage-controlled oscillation apparatus having a voltage-controlled oscillator and a temperature correcting apparatus for carrying out temperature correction of said voltage-controlled oscillator, said temperature correcting apparatus comprising:

a storing unit for storing correcting data for individual temperatures in correspondence with addresses representing the individual temperatures, the correcting data for an individual temperature being generated by dividing an actually measured waveform of correcting voltages, which are required by an apparatus to be corrected at each of a plurality of different temperatures, by a positive integer multiple of a minimum resolution of a D/A converter to obtain voltage digital values representing voltage values at individual dividing points of the actually measured waveform and times corresponding to the dividing points, and generating a plurality of pairs consisting of the voltage digital values and the corresponding times at each temperature as the correcting data;

temperature sensor means for detecting an ambient temperature of the apparatus to be corrected and producing a detection voltage;

an A/D converter for A/D converting the detection voltage to produce detection address representing the temperature, processing means for reading out correcting data from said storing unit according to the detection address, extracting or calculating the voltage digital values about the correcting voltages required by the detection address, and the times corresponding to the voltage digital values from the correcting data, and for sequentially outputting the resultant voltage digital values in synchronization with the times; and a D/A converter for generating correcting voltages to be supplied to said apparatus to be corrected by performing D/A conversion of the voltage digital values output.

6. The voltage-controlled oscillation apparatus according to claim 5, wherein said storing unit prestores correcting data of each of two different temperatures, and said processing means comprises:

read-out means for reading correcting data of each of the two temperatures in response to the detection address;

coefficient calculating means for calculating a temperature difference ratio of a temperature indicated by the detection address from the addresses of the correcting data of the two temperatures read out and from the detection address;

time calculating means for calculating output times for carrying out the D/A conversion from the times corresponding to the voltage digital values indicating same voltage values of the correcting data of the two temperatures and from the temperature difference ratio; and voltage digital value output means for sequentially outputting the voltage digital values of the same voltage values in synchronization with the calculated output times, as voltage digital values required by the detection address.

7. The voltage-controlled oscillation apparatus according to claim 5, wherein said storing unit prestores correcting data of each of a plurality of temperatures, and said processing means comprises:

temperature retrieval means for retrieving two addresses representing two adjacent temperatures closest to a temperature indicated by the detection address from a plurality of addresses in said storing unit in response to the detection address;

read-out means for reading the correcting data corresponding to the two retrieved addresses according to the two addresses;

coefficient calculating means for calculating a temperature difference ratio of a temperature indicated by the detection address from the correcting data of the two temperatures read out and from the detection address;

time calculating means for calculating output times for carrying out the D/A conversion from the times corresponding to the voltage digital values indicating same voltage values of the correcting data of the two temperatures and from the temperature difference ratio; and voltage digital value output means for sequentially outputting the voltage digital values of the same voltage values in synchronization with the calculated output times, as voltage digital values required by the detection address.

8. A voltage-controlled oscillation apparatus having a voltage-controlled oscillator and a temperature correcting apparatus for carrying out temperature correction of said voltage-controlled oscillator, said temperature correcting apparatus comprising:

a storing unit for storing a plurality of pairs of digital data consisting of pairs of voltage data and time data corresponding to the voltage data for each of a plurality of different detection addresses corresponding to a plurality of temperatures;

an A/D converter for carrying out A/D conversion of an ambient temperature detected by a temperature sensor, and for outputting a corresponding detection address through the A/D conversion;

a processor for acquiring, according to the detection address output from said A/D converter, a plurality of pairs of the digital data corresponding the detection address from said storing unit, and for sequentially outputting voltage data corresponding to the time data in response to timings determined by the time data of the digital data acquired; and a D/A converter for carrying out D/A conversion of the voltage data output from said processor, and for supplying D/A conversion results to said apparatus to be corrected, wherein said processor sequentially outputs the voltage data at intervals of a positive integer multiple of a minimum resolution of said D/A converter.

9. The voltage-controlled oscillation apparatus according to claim 5, wherein said voltage-controlled oscillation apparatus is supplied with the correcting voltage of a specified voltage waveform, and modulates a transmission wave of an FM-CW radar by the specified voltage waveform.

10. The voltage-controlled oscillation apparatus according to claim 8, wherein said voltage-controlled oscillation apparatus is supplied with the correcting voltage of a specified voltage waveform, and modulates a transmission wave of an FM-CW radar by the specified voltage waveform.

* * * * *